(12) United States Patent  
Choe et al.

(10) Patent No.: US 8,597,973 B2  
(45) Date of Patent: Dec. 3, 2013

(54) INK FOR FORMING THIN FILM OF SOLAR CELLS AND METHOD FOR PREPARING THE SAME, CIGS THIN FILM SOLAR CELL USING THE SAME AND MANUFACTURING METHOD THEREOF

(75) Inventors: Young-Ho Choe, Seoul (KR); Young-Hee Lee, Seoul (KR); Yong-Woo Choi, Seoul (KR); Hyung-Seok Kim, Seoul (KR); Ho-Gyoung Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 20 days.

(21) Appl. No.: 13/338,136

(22) Filed: Dec. 27, 2011

(65) Prior Publication Data

US 2012/0100661 A1   Apr. 26, 2012

Related U.S. Application Data

(62) Division of application No. 12/081,238, filed on Apr. 11, 2008, now abandoned.

(30) Foreign Application Priority Data

Sep. 18, 2007 (KR) .......................... 10-2007-0094788

(51) Int. Cl.  
*H01L 31/18* (2006.01)

(52) U.S. Cl.  
USPC .............................................. 438/89; 438/85

(58) Field of Classification Search  
USPC .................................................. 438/84, 87, 89  
See application file for complete search history.

(56) References Cited

U.S. PATENT DOCUMENTS

| 6,259,016 | B1 | 7/2001 | Negami et al. |
| 6,821,559 | B2 * | 11/2004 | Eberspacher et al. ........ 427/226 |
| 7,700,464 | B2 * | 4/2010 | Robinson et al. ............. 438/502 |
| 8,309,163 | B2 * | 11/2012 | Van Duren et al. ............. 427/74 |

(Continued)

FOREIGN PATENT DOCUMENTS

| JP | 5-63224 A | 3/1993 |
| JP | 10-64925 A | 3/1998 |

(Continued)

OTHER PUBLICATIONS

Eberspacher, Fredric, Pauls, Serra, Thin-films CIS alloy PV materials fabricated using non-vacuum, particles-based techniques, Thin Solid Films, 387, 2001, 18-22.

*Primary Examiner* — David Vu  
*Assistant Examiner* — Earl Taylor  
(74) *Attorney, Agent, or Firm* — Birch, Stewart, Kolasch & Birch, LLP (57) ABSTRACT

Discussed are an ink containing nanoparticles for formation of thin film of a solar cell and its preparation method, CIGS thin film solar cell having at least one light absorption layer formed by coating or printing the above ink containing nanoparticles on a rear electrode, and a process for manufacturing the same. More particularly, the above absorption layer includes Cu, In, Ga and Se elements as constitutional ingredients thereof and such elements exist in the light absorption layer by coating or printing an ink that contains $Cu_2Se$ nanoparticles and $(In,Ga)_2Se_3$ nanoparticles on the rear electrode, and heating the treated electrode with the ink. Since $Cu(In,Ga)Se_2$ (CIGS) thin film is formed using the ink containing nanoparticles, a simple process is used without requirement of vacuum processing or complex equipment and particle size of the thin film, Ga doping concentration, etc., can be easily regulated.

10 Claims, 9 Drawing Sheets

(56) References Cited

U.S. PATENT DOCUMENTS

| | | | |
|---|---|---|---|
| 8,329,501 B1* | 12/2012 | Robinson et al. | 438/93 |
| 8,372,734 B2* | 2/2013 | Van Duren et al. | 438/502 |
| 2002/0006470 A1* | 1/2002 | Eberspacher et al. | 427/216 |
| 2005/0183767 A1 | 8/2005 | Yu et al. | |
| 2006/0062902 A1* | 3/2006 | Sager et al. | 427/74 |
| 2006/0207644 A1* | 9/2006 | Robinson et al. | 136/243 |
| 2007/0163383 A1* | 7/2007 | Van Duren et al. | 75/255 |
| 2007/0163637 A1* | 7/2007 | Robinson et al. | 136/262 |
| 2007/0163638 A1* | 7/2007 | Van Duren et al. | 136/262 |
| 2007/0163639 A1* | 7/2007 | Robinson et al. | 136/262 |
| 2007/0163640 A1* | 7/2007 | Van Duren et al. | 136/262 |
| 2007/0163642 A1* | 7/2007 | Van Duren et al. | 136/262 |
| 2007/0163644 A1* | 7/2007 | Van Duren et al. | 136/262 |
| 2007/0169809 A1* | 7/2007 | Van Duren et al. | 136/262 |
| 2007/0169810 A1* | 7/2007 | Van Duren et al. | 136/262 |
| 2007/0169811 A1* | 7/2007 | Van Duren et al. | 136/262 |
| 2008/0121277 A1* | 5/2008 | Robinson et al. | 136/256 |
| 2008/0124831 A1* | 5/2008 | Robinson et al. | 438/84 |
| 2009/0107550 A1* | 4/2009 | Van Duren et al. | 136/262 |
| 2010/0319776 A1* | 12/2010 | Choe et al. | 136/262 |
| 2012/0100661 A1* | 4/2012 | Choe et al. | 438/63 |

FOREIGN PATENT DOCUMENTS

| | | |
|---|---|---|
| JP | 2000-323733 A | 11/2000 |
| WO | WO 2007-029928 A | 3/2007 |
| WO | WO 2007-101136 A | 9/2007 |
| WO | WO 2007/108932 A2 | 9/2007 |

* cited by examiner

INK FOR FORMING THIN FILM OF SOLAR CELLS AND METHOD FOR PREPARING THE SAME, CIGS THIN FILM SOLAR CELL USING THE SAME AND MANUFACTURING METHOD THEREOF

This application is a Divisional of application Ser. No. 12/081,238 filed on Apr. 11, 2008, now abandoned which claims priority to Korean Patent Application No. 10-2007-0094788, filed on Sep. 18, 2007. The entire contents of all of the above applications are hereby incorporated by reference.

BACKGROUND OF THE INVENTION

1. Field of the Invention

The present invention relates to an ink containing nanoparticles for formation of thin film of a solar cell and its preparation method, CIGS thin film solar cell (abbrev. to "CIGS solar cell") and a method for manufacturing the same by using the ink. More particularly, the present invention relates to CIGS thin film solar cells and a method of manufacturing the same, comprising formation of a CIGS thin film by only a printing process of an ink containing nanoparticles without requirement of vacuum processing or complex equipment, characterized in that it can freely adjust Cu/(In+Ga) ratio and/or Ga/(In+Ga) ratio of the CIGS thin film and form the CIGS thin film through a simple coating or printing process.

2. Description of the Related Art

A solar cell is a device to convert light energy into electric energy by a photo-voltaic effect. The solar cell is generally classified into silicon solar cell, thin film solar cell, dye sensitive solar cell and organic polymer solar cell on the basis of constitutional substances of the cell.

Such a solar cell is independently employed as a main power source for electronic clock, radio set, un-manned light house, satellite, rocket, etc. and is connected to a regular AC power supply system to serve as an auxiliary power source. As a demand for alternative energy grows, an interest in solar cells is increasing.

For the solar cell, it is very important to increase conversion efficiency related to a conversion rate of incident sunlight into electrical energy. There are a number of studies and examinations to increase the conversion efficiency. Also, Technical developments are actively underway, which include an art of applying a thin film with high light absorption coefficient to the solar cell in order to improve the conversion efficiency.

As one of materials with high light absorption coefficient, CIGS (copper indium gallium selenide) was proposed to enhance light absorption coefficient of a thin film solar cell when using CIGS to produce the thin film solar cell.

In recent years, there have been suggested methods for formation of CIGS films for CIGS solar cells including, for example: co-evaporation method of Cu, In, Ga and Se; selenization method under Se or $H_2Se$ atmosphere after formation of Cu, In and Ga films by means of sputtering or vapor deposition; and the like.

Methods for formation of CIGS thin films using printing processes are now proposed, which do not need an expensive vacuum process and are, thus, advantageous to reduce production costs in manufacturing solar cells.

However, among the printing processes, a method for reduction and selenization of copper indium oxide film using a precursor has disadvantages in that it necessarily demands the reduction stage and uses $H_2Se$, known to be a toxic gas, therefore, is not preferable and/or has serious problems in its application to manufacturing CIGS solar cells.

In order to reach the highest conversion efficiency, CIGS preferably has a band gap ranging from 1.2 to 1.4 eV. The band gap can be controlled by altering Ga doping concentrations and, in order to obtain the best band gap energy, the doping process should be carried out with the compositional ratio of Ga/(In+Ga) (hereinafter, abbrev. to "Ga/(In+Ga) ratio") ranging from 0.3 to 0.6. However, in case of using a Copper Indium Oxide thin film, Ga is precipitated therein and it is difficult to dope the thin film at a constant ratio therewith.

In regard to the CIGs thin film, if Cu/(In+Ga) ratio is less than 1, a Cu-poor single chalcopyrite phase is generated which has poor performance due to a small grain size. On the other hand, when Cu/(In+Ga) ratio is more than 1, the grain size is increased which results in the performance being more improved, but, in a Cu-rich phase, there are disadvantages in that $Cu_2Se$ impurities are generated and derive a decrease in the light conversion efficiency caused by higher conductivity of $Cu_2Se$.

In order to accomplish advantages in both of the cases that Cu/(In+Ga) ratio is more than or less than 1, there is required a multi-stage process for regulating a concentration of Cu/(In+Ga) step by step.

Accordingly, there is a requirement for techniques to form CIGS thin films of CIGS solar cells, which can form CIGS thin films without requirement of expensive vacuum processes and/or complex equipment, freely regulate Cu/(In+Ga) ratio and Ga/(In+Ga) ratio and alter concentration of Cu/(In+Ga) step by step through the multi-stage process.

SUMMARY OF THE INVENTION

Accordingly, the present invention is directed to solve the problems described above and an object of the present invention is to provide a CIGS solar cell comprising CIGS thin film formed by only a printing process of an ink containing nanoparticles without requirement of alternative vacuum processing or complex equipment, characterized in that Cu/(In+Ga) and Ga/(In+Ga) ratios of the CIGS thin film can be freely regulated.

Another object of the present invention is to provide an ink containing nanoparticles which is used to manufacture CIGS solar cell described above and a method for preparing the ink.

A still further object of the present invention is to provided a method for formation of CIGS thin film for CIGS solar cell, comprising use of a multi-stage process as well as a printing process to lead to production of the CIGS solar cell with high conversion efficiency.

In order to achieve the above objects, the CIGS thin film solar cell of the present invention has at least one light absorption layer which comprises at least one element selected from Cu, In, Ga, Se and S and is formed by coating or printing an ink that contains $Cu_2(Se_{1-x}S_x)$ nanoparticles and $(In,Ga)_2(Se_{1-y}S_y)_3$ nanoparticles on a rear electrode of the cell, wherein x and y satisfy $0 \leq x \leq 1$ and $0 \leq y \leq 1$.

The above ink further contains $In_2(Se_{1-z}S_z)_3$ nanoparticles wherein z satisfies $0 \leq z \leq 1$.

In order to achieve the above objects, the CIGS thin film solar cell of the present invention also has at least one light absorption layer which comprises a compound with particle size of 0.01 to 100 nm having at least one element selected from Cu, In, Ga, Se and S, and may contain dispersant and surfactant in sum of 0 to 10% by weight to total weight of the light absorption layer.

Furthermore, the present invention provides a CIGS thin film solar cell comprising a rear electrode, a light absorption layer and a front electrode layer arranged in order on a substrate, in which the light absorption layer comprises at least one element selected from Cu, In, Ga, Se and S and is formed by coating or printing an ink that contains $Cu_2(Se_{1-x}S_x)$ nanoparticles and $(In,Ga)_2(Se_{1-y}S_y)_3$ nanoparticles on the rear electrode of the cell, wherein x and y satisfy $0 \leq x \leq 1$ and $0 \leq y \leq 1$.

The above ink further contains $In_2(Se_{1-z}S_z)_3$ nanoparticles wherein z satisfies $0 \leq z \leq 1$.

The light absorption layer of the CIGS solar cell according to the present invention is characterized in that Ga/(In+Ga) or Cu/(In+Ga) ratio of the said light absorption layer is regulated by a mixing ratio of said $Cu_2(Se_{1-x}S_x)$ nanoparticles and said $(In,Ga)_2(Se_{1-y}S_y)_3$ nanoparticles.

Ga/(In+Ga) ratio of the said light absorption layer is not particularly limited but, preferably, satisfies a range of 0.3 to 0.6.

The ink for forming thin film for solar cell of the present invention can be prepared by mixing at least one selected from $Cu_2(Se_{1-x}S_x)$ nanoparticles, $(In,Ga)_2(Se_{1-y}S_y)_3$ nanoparticles and $In_2(Se_{1-z}S_z)_3$ nanoparticles in an organic solvent, wherein x, y and z satisfy $0 \leq x \leq 1$, $0 \leq y \leq 1$ and $0 \leq z \leq 1$.

The organic solvent is at least one selected from a group consisting of toluene, chloroform, DMF (dimethylformamide), DMSO (dimethyl sulfoxide), pyridine, alcohol and hydrocarbons.

The hydrocarbons may have one (1) to twenty (20) carbon atoms often indicated as C1 to C20, and include chain hydrocarbons, cyclic hydrocarbons, aliphatic hydrocarbons and aromatic hydrocarbons but are not particularly limited thereto.

The ink may further comprise a dispersant, which is at least one selected from a group consisting of alkaneselenol, alkanethiol, alcohol, aromatic selenol, aromatic thiol and aromatic alcohol.

Number of carbon atoms in the above materials is not particularly limited, but, preferably, ranges from 1 to 20.

The method of making an ink for forming thin film for solar cell according to the present invention comprises the steps of: preparing an organic solvent; mixing at least one selected from $Cu_2(Se_{1-x}S_x)$ nanoparticles, $(In,Ga)_2(Se_{1-y}S_y)_3$ nanoparticles and $In_2(Se_{1-z}S_z)_3$ nanoparticles in the organic solvent; heating the mixture, wherein x, y and z satisfy $0 \leq x \leq 1$, $0 \leq y \leq 1$ and $0 \leq z \leq 1$.

After mixing the nanoparticles in the organic solvent, the dispersant can be added to the mixture and heat treated.

The heating is preferably performed at 500 to 600° C. under Se or S atmosphere.

Further description in detail about the organic solvent and the dispersant is not included in the present invention, in order to avoid duplication of explanation thereof.

A method for manufacturing the CIGS solar cell according to the present invention in order to accomplish the above objects, comprises the steps of: coating or printing an ink containing at least one selected from $Cu_2(Se_{1-x}S_x)$ nanoparticles, $(In,Ga)_2(Se_{1-y}S_y)_3$ nanoparticles and $In_2(Se_{1-z}S_z)_3$ nanoparticles on a rear electrode arranged on a substrate; and heating the ink to form a light absorption layer, wherein x, y and z satisfy $0 \leq x \leq 1$, $0 \leq y \leq 1$ and $0 \leq z \leq 1$.

The above method of the present invention further includes the steps of: coating or printing an ink containing $(In,Ga)_2(Se_{1-w}S_w)_3$ nanoparticles on the light absorption layer formed by heating; and again heating the ink, wherein w satisfies $0 \leq w \leq 1$.

Another method for manufacturing the CIGS solar cell according to the present invention in order to accomplish the above objects, comprises the steps of: laminating a first light absorption layer formed by coating or printing an ink containing $(In,Ga)_2(Se_{1-a}S_a)_3$ nanoparticles and heating the ink, and a second light absorption layer formed by coating or printing another ink containing $Cu_2(Se_{1-b}S_b)$ nanoparticles and heating the ink in turns on a rear electrode formed on a substrate to form a multi-layer laminate, wherein a and b satisfy $0 \leq a \leq 1$ and $0 \leq b \leq 1$.

The heating method is preferably performed at 500 to 600° C. under Selenium (Se) or Sulfur (S) atmosphere.

The nanoparticles contained in the ink according to the present invention in nano units which is not particularly limited, but, preferably, ranges from 0.01 to 100 nm.

According to the method for formation of the CIGS thin film for the CIGS solar cell of the present invention, the CIGS thin film can be formed by only a simple printing process of the nanoparticle ink without requirement of vacuum processing and/or complex equipment.

Moreover, the grain size of the CIGS thin film can be preferably controlled by freely regulating Cu/(In+Ga) ratio in the CIGS thin film, so that the solar cell has improved performance.

Similarly, free regulation of Ga/(In+Ga) ratio in the CIGS thin film can control the doping concentration of Ga to a desired level, thereby forming the CIGS thin film with the best band gap energy.

In addition, using a multi-stage process together with the printing process in the formation of CIGS thin film can manufacture the CIGS solar cell with high conversion efficiency according to the present invention.

Features of the present invention described above and other advantages will be more clearly understood by the following non-limited examples, which are not intended to restrict the scope of the invention but are instead illustrative embodiments of the present invention.

BRIEF DESCRIPTION OF THE DRAWINGS

These and other objects, features, aspects, and advantages of the present invention will be more fully described in the following detailed description for preferred embodiments and examples, taken in conjunction with the accompanying drawings. In the drawings.

DETAILED DESCRIPTION OF THE INVENTION

According to an embodiment of the present invention in order to accomplish the above objects, there is provided a CIGS solar cell that comprises a light absorption layer containing Cu, In, Ga and Se elements, in which the elements exist in a thin film formed by coating or printing an ink containing $Cu_2Se$ nanoparticles and $(In,Ga)_2Se_3$ nanoparticles on a rear electrode of the solar cell.

In a more particular embodiment of the present invention, the CIGS solar cell according to the present invention comprises: a substrate; a rear electrode formed on the substrate; a light absorption layer formed on the rear electrode; a buffer layer formed on the light absorption layer; a window layer formed on the buffer layer; and a front electrode layer formed on the window layer, wherein the light absorption layer contains Cu, In, Ga and Se elements as constitutional ingredients and such elements exist in the light absorption layer by coating or printing an ink containing at least $Cu_2Se$ nanoparticles and $(In,Ga)_2Se_3$ nanoparticles on the rear electrode of the solar cell.

The front electrode layer of the solar cell can be positioned on a part of the top portion of the window layer and, optionally, an anti-reflection film can be formed on the other parts of the top portion of the window layer. The anti-reflection film functions to prevent light absorbed in the light absorption layer from being transmitted outside.

A preferred embodiment of the method for formation of CIGS thin film as the light absorption layer of the CIGS solar cell according to the present invention comprises the steps of: coating or printing an ink containing $Cu_2Se$ nanoparticles and $(In,Ga)_2Se_3$ nanoparticles on a rear electrode; and heating the resulting product to form the thin film. This can form a light absorption layer by preparing a composite ink containing both of the above nanoparticles.

The composite ink may further contain $In_2Se_3$ nanoparticles.

Additionally, the composite ink may further include the dispersant described above.

A further preferred embodiment of the method for formation of CIGS thin film as the light absorption layer of the CIGS solar cell according to the present invention comprises the steps of: coating or printing an ink containing $(In,Ga)_2Se_3$ nanoparticles on a rear electrode arranged on a substrate and heating the ink to form a first film; coating or printing another ink containing $Cu_2Se$ nanoparticles on the first film and heating the ink to form a second film; and coating or printing an ink containing $(In,Ga)_2Se_3$ nanoparticles on the second film and heating the ink to form a third film. This method is to form a light absorption layer by coating the ink containing a single kind of nanoparticles on the rear electrode step by step, and can be used to form a plurality of light absorption layers containing different constitutional ingredients depending on the species of nanoparticles.

The above method is only an illustrative and non-limiting example of the present invention, therefore, a number of light absorption layers with different light absorptivities and light conversion efficiencies can be formed by varying the constitutional ingredients and their compositional ratios of the nanoparticles contained in the inks, and can be laminated to form a multi-layer laminate.

As a further particular embodiment of the present invention, there is provided an ink containing nanoparticles used to form the light absorption layer of the CIGS solar cell according to the present invention.

The said ink is prepared by mixing $Cu_2Se$ nanoparticles and $(In,Ga)_2Se_3$ nanoparticles in an organic solvent such as chloroform, toluene, etc. and, optionally, adding a dispersant such as thiols, selenols, alcohols, etc.

The said ink may be carried out heat treatment at high temperature.

Hereinafter, the present invention will become apparent from the following various embodiments with reference to the accompanying drawings.

With regard to the method of preparing the ink containing Se compound based nanoparticles in order to form the CIGS thin film of the CIGS solar cell according to the present invention, the ink is easily prepared by adding the solvent and the dispersant to $Cu_2Se$ nanoparticles, $(In,Ga)_2Se_3$ nanoparticles, and/or $In_2Se_3$ nanoparticles, respectively; and homogeneously mixing the nanoparticles in the solvent and the dispersant. Hereinafter, the prepared ink containing the nanoparticles based on selenium compound is referred to $Cu_2Se$ nanoparticle ink, $(In,Ga)_2Se_3$ nanoparticle ink, $In_2Se_3$ nanoparticle ink, respectively.

The solvent used to prepare the ink includes, for example, organic solvents and is at least one selected from a group consisting of toluene, chloroform, Pimethylformamide DMF, Dimethylsulfoxide DMSO, pyridine, alcohol and hydrocarbons.

The hydrocarbons may have one (1) to twenty (20) carbon atoms.

The ink may optionally include the dispersant which is at least one selected from a group consisting of alkaneselenol, alkanethiol, alcohol, aromatic selenol, aromatic thiol and aromatic alcohol.

Number of carbon atoms in the above dispersants is not particularly limited but, preferably, could be 1 to 20.

Figure 1:
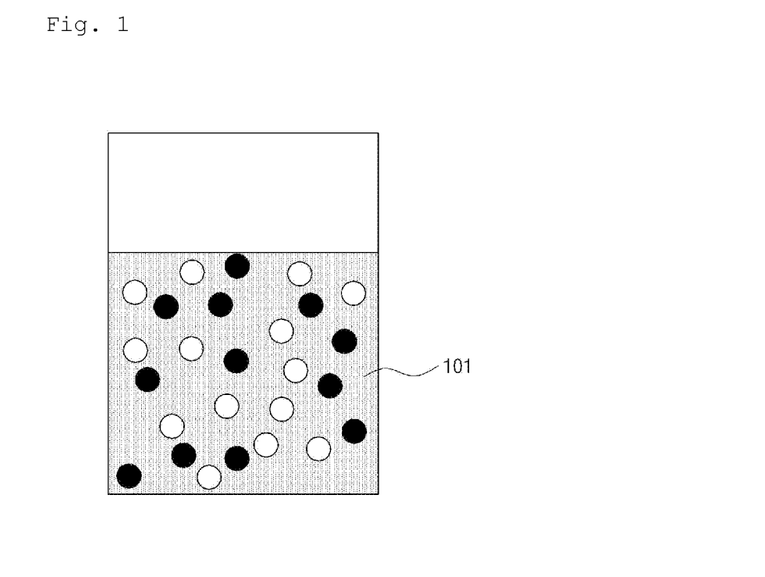
FIGS. 1 to 3 are cross sectional views sequentially illustrating CIGS thin films with controlled Cu/(In+Ga) ratio formed by one embodiment of the manufacturing process according to the present invention.
Figure 2:
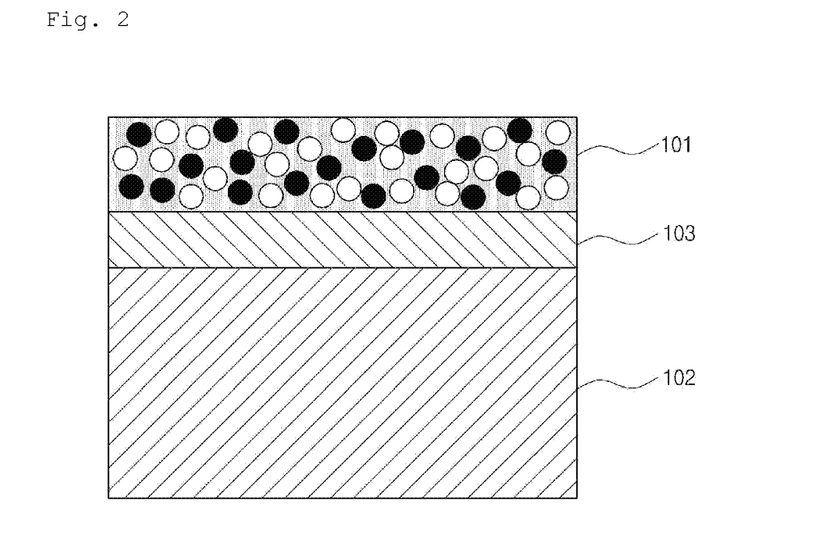
Figure 3:
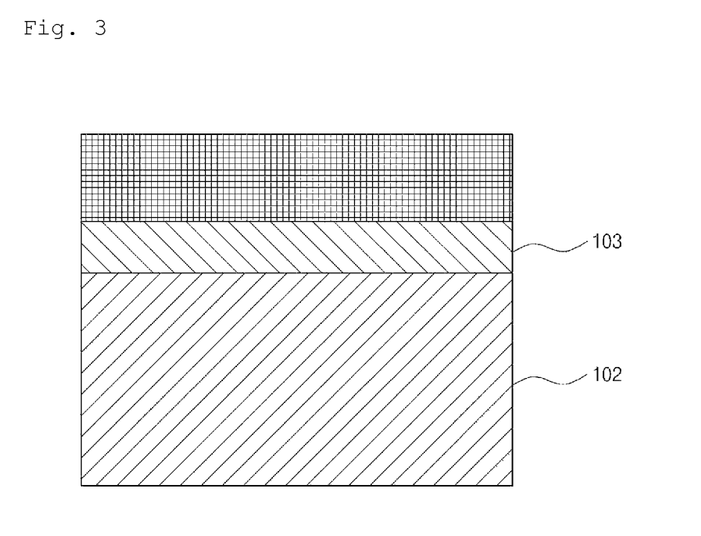

Concentration of each of the nanoparticle inks to be used is not particularly limited and is variable in consideration of features of thin films to be formed as end products. Also, relative concentrations of respective nanoparticles are not particularly limited since constitutional ratios of the nanoparticles are variable according to desirable features of the thin films as the end products. A more detailed description on this is as follows:

FIGS. 1 to 3 are cross sectional views sequentially illustrating CIGS thin films with controlled Cu/(In+Ga) ratio formed by one embodiment of the method for formation of CIGS thin film for CIGS solar cell according to the present invention.

At first, as shown in FIG. 1, $Cu_2Se+(In,Ga)_2Se_3$ nanoparticle ink 101 is prepared by mixing $Cu_2Se$ nanoparticle ink and $(In,Ga)_2Se_3$ nanoparticle ink together in a desired mixing ratio thereof. Compositional ratios between the nanoparticle inks can be appropriately regulated in terms of desirable Cu/(In+Ga) ratio by taking molecular weights of $Cu_2Se$ and $(In,Ga)_2Se_3$ into consideration.

Next, as shown in FIG. 2, the prepared $Cu_2Se+(In,Ga)_2Se_3$ nanoparticle ink 101 is applied to a substrate 102 generally used for CIGS solar cells and a rear electrode 103 coated on the substrate. Preferably, the coating or printing process is adopted for the application process.

The substrate 102 is made of sheet glass or metal foil, which is conventionally used in manufacturing the CIGS solar cells.

Materials for the rear electrode 103 are not particularly limited so far as the materials are conductive metals. The rear electrode can comprise not only a molybdenum (Mo) layer as an illustrative example according to the embodiment of the present invention, but also nickel (Ni) layer and copper (Cu) layer. However, in views of high electric conductivity, ohmic contact in CIGS, high temperature stability under Se atmosphere and so on, Mo is preferably used for the rear electrode.

The Mo based rear electrode 103 functions as a rear contact layer of the solar cell.

Finally, as shown in FIG. 3, heating under Se atmosphere results in CIGS thin film with controlled Cu/(In+Ga) ratio.

The gas atmosphere for the heating is not particularly limited to Se, but, may possibly be S atmosphere depending on constitutional materials of the nanoparticle ink.

Temperature for the heating is not particularly limited, but, preferably could be 500 to 600° C.

Since the CIGS thin film with the controlled Cu/(In+Ga) ratio is formed by the above processes, the grain size of the CIGS thin film can be easily regulated and, thus, accomplish the manufacture of solar cells with desired features and/or performance.

Figure 4:
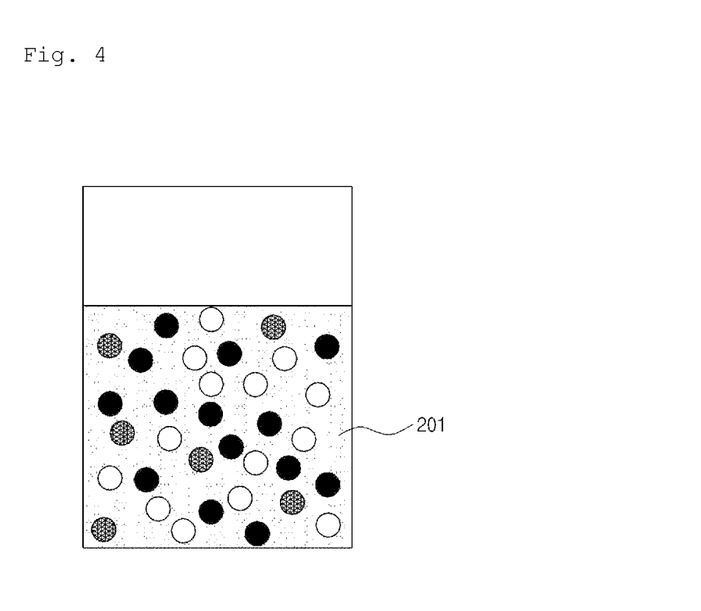
FIGS. 4 to 6 are cross sectional views sequentially illustrating CIGS thin films with controlled Ga/(In+Ga) ratio formed by another embodiment of the manufacturing process of the present invention.
Figure 5:
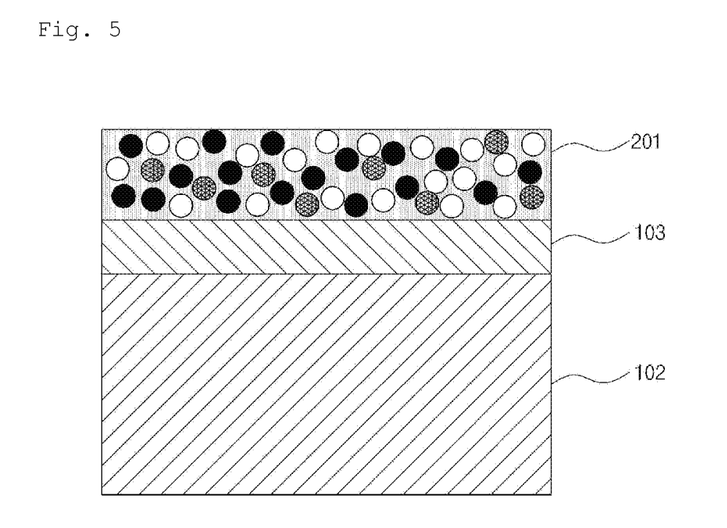
Figure 6:
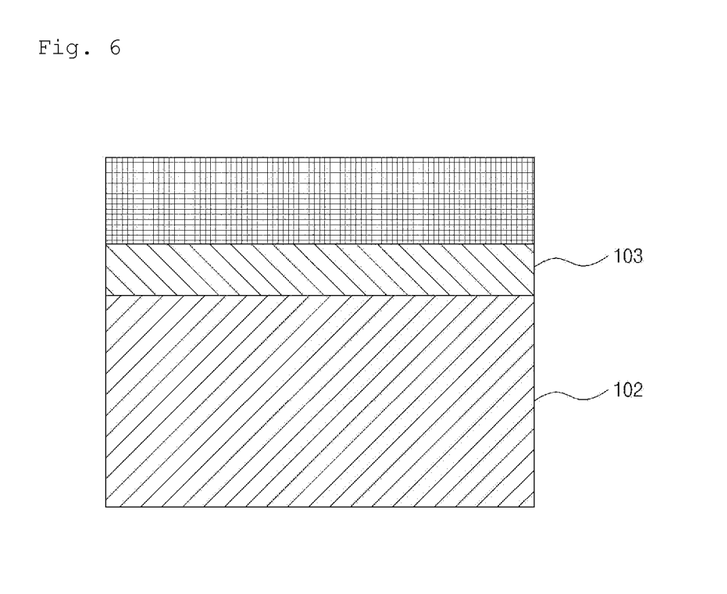

FIGS. 4 to 6 are cross sectional views sequentially illustrating CIGS thin films with controlled Ga/(In+Ga) ratio as well as the controlled Cu/(In+Ga) ratio, formed by another embodiment of the method for formation of CIGS thin film for CIGS solar cell according to the present invention.

First of all, as shown in FIG. 4, $Cu_2Se+(In,Ga)_2Se_3+In_2Se_3$ nanoparticle ink 201 is prepared by mixing $Cu_2Se$ nanoparticle ink, $(In,Ga)_2Se_3$ nanoparticle ink and $In_2Se_3$ nanoparticle ink together in a desired mixing ratio thereof. Compositional ratios between the nanoparticle inks can be appropriately regulated in terms of desirable Cu/(In+Ga) ratio and Ga/(In+Ga) ratio by taking molecular weights of $Cu_2Se$, $(In,Ga)_2Se_3$ and $In_2Se_3$ into consideration.

Next, as shown in FIG. 5, the prepared $Cu_2Se+(In,Ga)_2Se_3+In_2Se_3$ nanoparticle ink 201 is applied to a substrate 102 generally used for CIGS solar cells and the Mo layer 103 formed on the substrate 102. Preferably, the printing process is adopted for the application process.

Finally, as shown in FIG. 6, heating of the treated substrate 102 with $Cu_2Se+(In,Ga)_2Se_3+In_2Se_3$ nanoparticle ink 201 under Se atmosphere results in CIGS thin film with controlled Cu/(In+Ga) ratio and Ga/(In+Ga) ratio.

By the above processes, Ga/(In+Ga) ratio can be freely regulated to lead to the manufacture of CIGS solar cells with the best band gap energy. More particularly, the band gap energy preferably ranges from 1.2 to 1.4 eV in order to manufacture the CIGS solar cell with the highest conversion efficiency. Such band gap energy is varied by Ga doping process and, in case of regulating Ga/(In+Ga) ratio to about 0.3 to 0.6 according to a process illustrated in FIGS. 4 and 6, the above optimal band gaps can be obtained.

FIGS. 7 to 11 are cross sectional views sequentially illustrating CIGS thin films formed by the multi-stage process according to one embodiment of the present invention.

Figure 7:
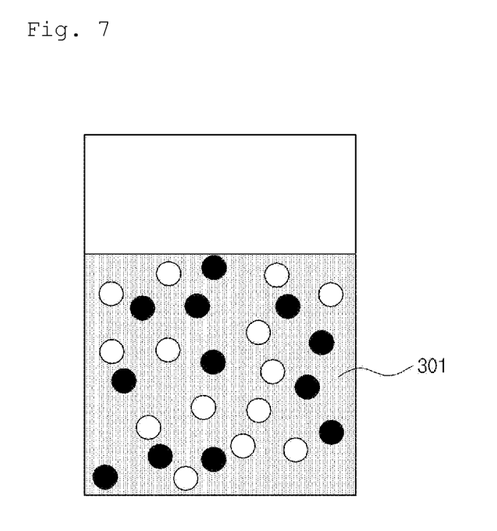
FIGS. 7 to 11 are cross sectional views sequentially illustrating CIGS thin films formed by the multi-stage process according to one embodiment of the present invention.

First of all, as shown in FIG. 7, $Cu_2Se+(In,Ga)_2Se_3$ nanoparticle ink 301 is prepared by mixing $Cu_2Se$ nanoparticle ink and $(In,Ga)_2Se_3$ nanoparticle ink together in a desired mixing ratio thereof. Herein, the nanoparticle ink 301 is in $Cu_2Se+(In,Ga)_2Se_3$:Cu-rich condition by relatively increasing an amount of $Cu_2Se$ nanoparticles to be more than that of $(In,Ga)_2Se_3$ nanoparticles.

Figure 8:
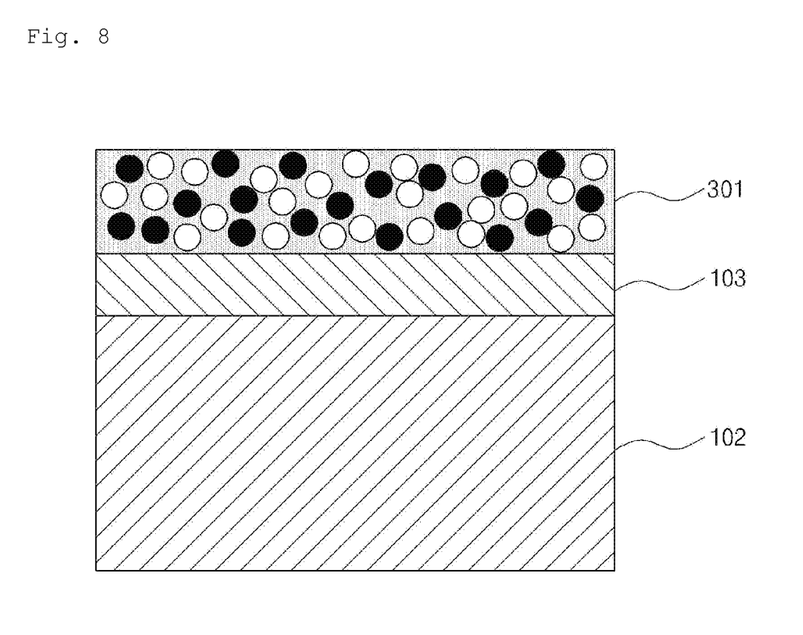
Figure 9:
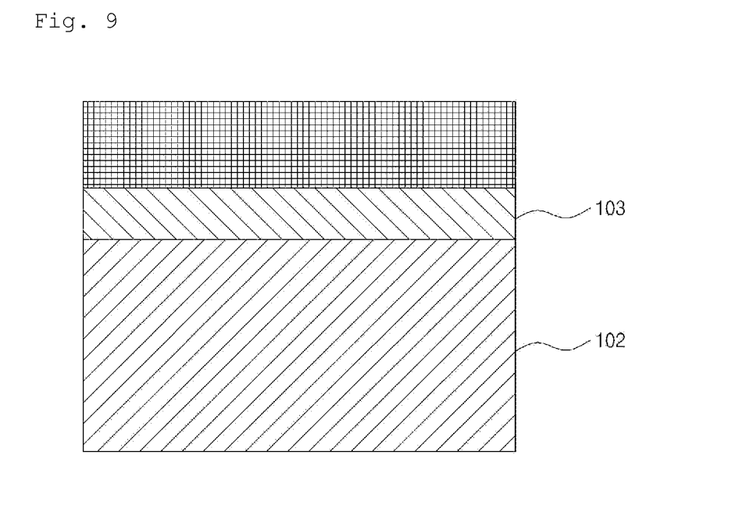

Next, as shown in FIG. 8, the prepared $Cu_2Se+(In,Ga)_2Se_3$ nanoparticle ink 301 is coated (or printed) to the Mo layer 103 followed by heating under Se atmosphere as shown in FIG. 9, thereby forming Cu-rich CIGS thin film. The Cu-rich CIGS thin film has Cu/(In+Ga) ratio more than 1, because of using the Cu-rich $Cu_2Se+(In,Ga)_2Se_3$: nanoparticle ink 301.

Figure 10:
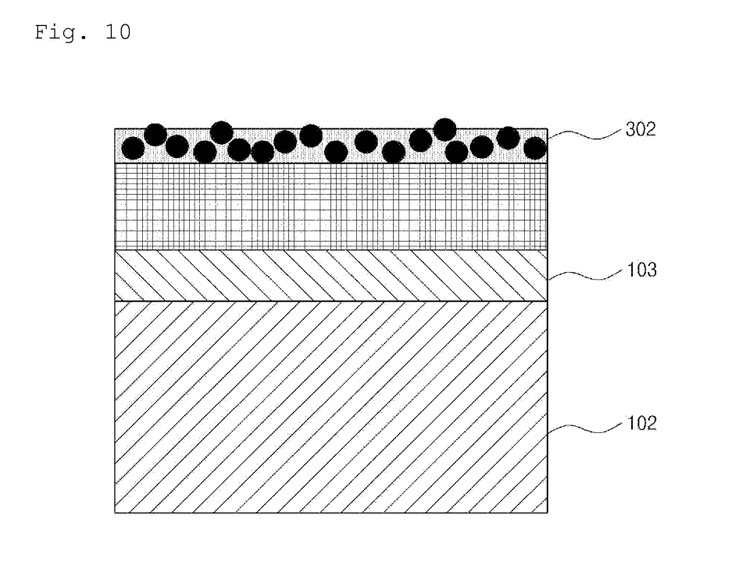
Figure 11:
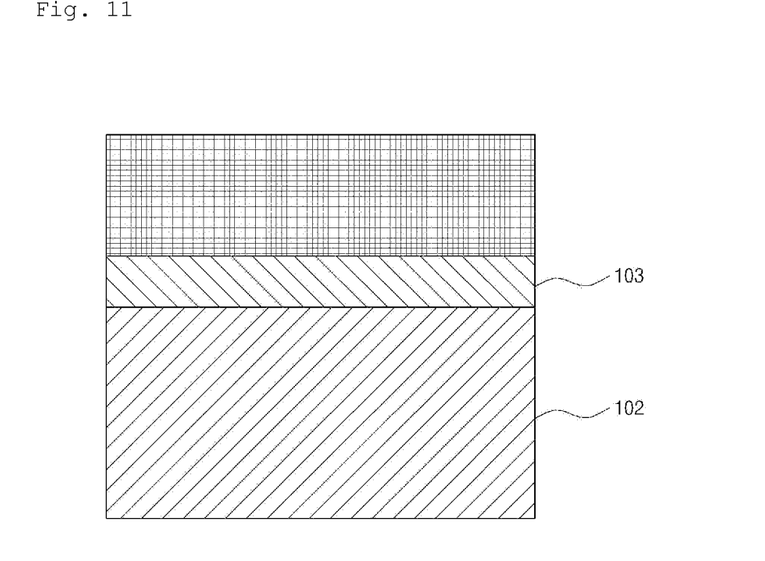

Finally, as shown in FIGS. 10 and 11, $(In,Ga)_2Se_3$ nanoparticle ink 302 is coated (or printed) to the said Cu-rich CIGS thin film followed by heating under Se atmosphere. Since the $(In,Ga)_2Se_3$ nanoparticle ink 302 does not contain Cu, the ratio of Cu in the resulting CIGS thin film as shown in FIGS. 10 and 11 is reduced and Cu/(In+Ga) ratio of optionally could be less than 1.

FIGS. 12 to 17 are cross sectional views sequentially illustrating CIGS thin films formed by the multi-stage process according to another embodiment of the present invention.

Figure 12:
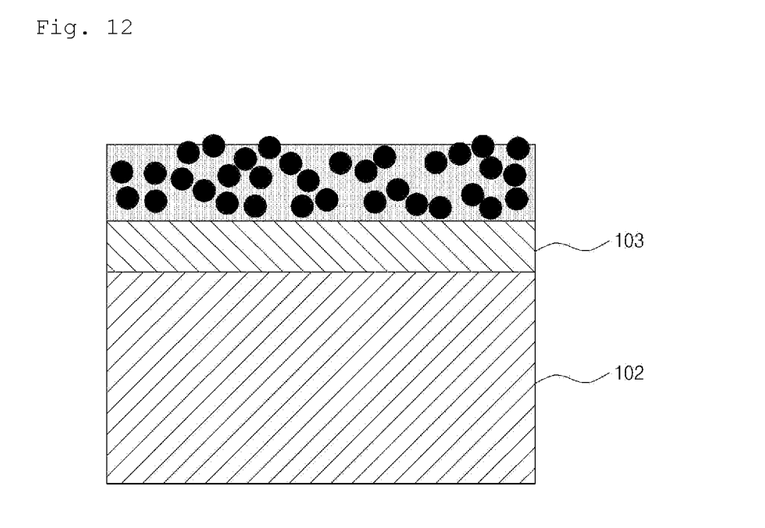
FIGS. 12 to 17 are sectional views sequentially illustrating CIGS thin films formed by the multi-stage process according to another embodiment of the present invention.
Figure 13:
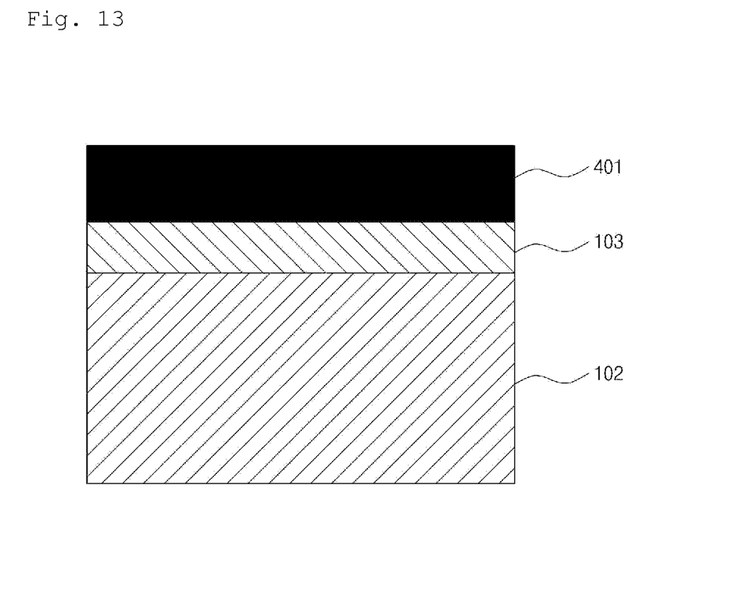

First of all, as shown in FIGS. 12 and 13, $(In,Ga)_2Se_3$ thin film 401 is formed by printing $(In,Ga)_2Se_3$ nanoparticle ink on the Mo layer 103 formed on the substrate 102 followed by heating under Se atmosphere.

Figure 14:
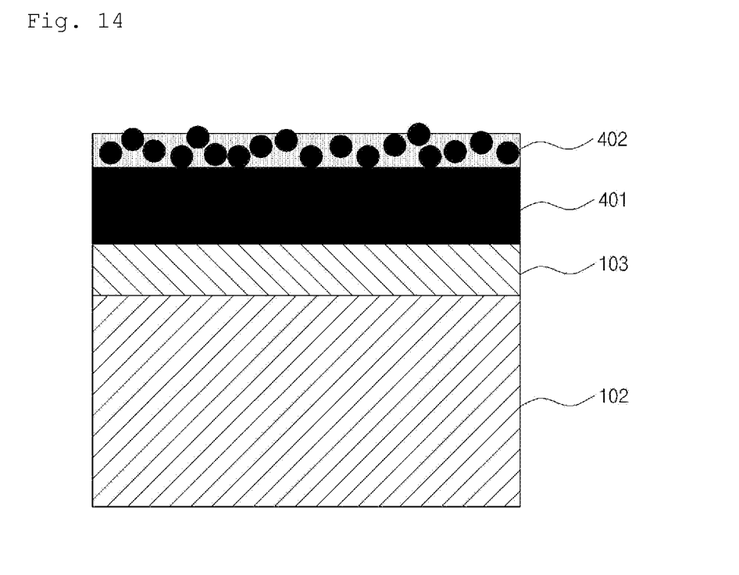
Figure 15:
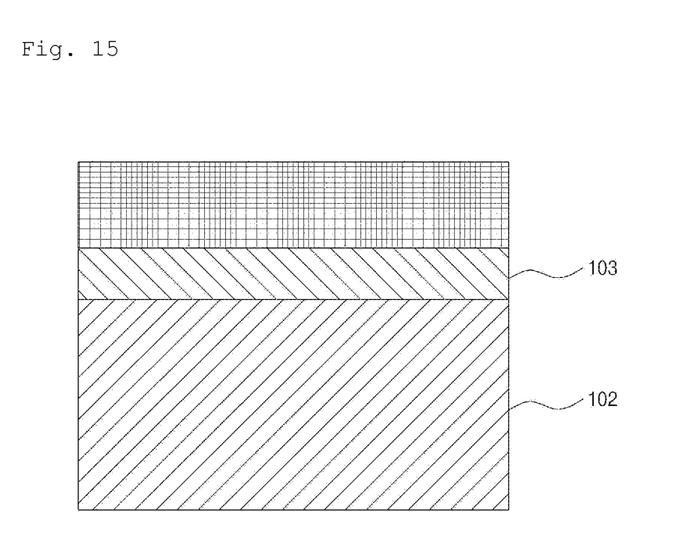

Next, as shown in FIGS. 14 and 15, $Cu_2Se_3$ nanoparticle ink 402 is printed on the said $(In,Ga)_2Se_3$ thin film 401 followed by heating under Se atmosphere, thereby forming Cu-rich CIGS thin film with high Cu content. Herein, the Cu-rich CIGS thin film can have Cu/(In+Ga) ratio more than 1 by regulating an amount of $Cu_2Se_3$ nanoparticle ink 402.

Figure 16:
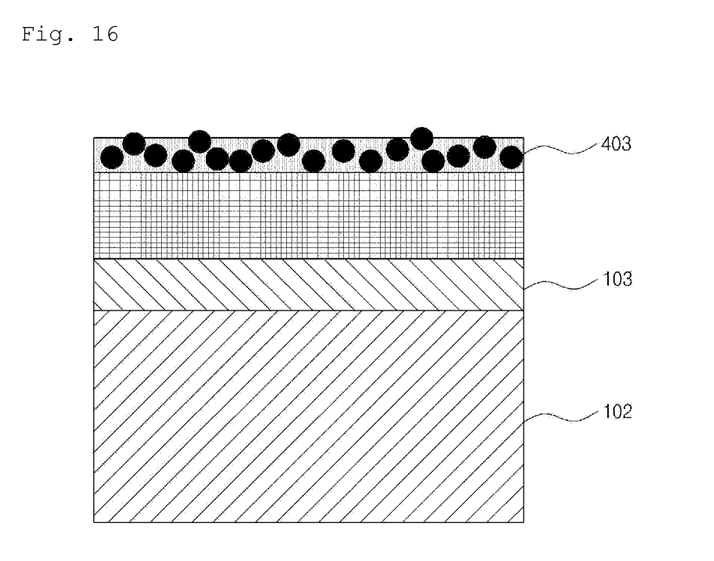
Figure 17:
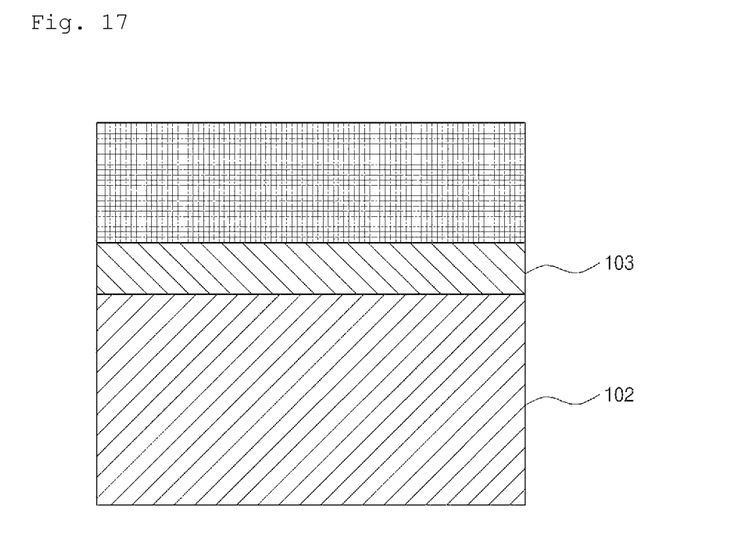

Finally, as shown in FIGS. 16 and 17, $(In,Ga)_2Se_3$ nanoparticle ink 403 is printed on the said Cu-rich CIGS thin film followed by heating under Se atmosphere, thereby forming Cu-poor CIGS thin film with poor Cu content. Herein, the Cu-poor CIGS thin film can have Cu/(In+Ga) ratio of less than 1 by regulating an amount of $(In,Ga)_2Se_3$ nanoparticle ink 403.

As illustrated in FIGS. 7 to 11 and FIGS. 12 to 17, the present invention can produce CIGS thin films by means of multi-stage processes while using the printing process, so that it can simultaneously achieve advantages both when Cu/(In+Ga) ratio is more than 1 and less than 1. Briefly, the present invention can prevent generation of impurities such as $Cu_2Se$ and, at the same time, form CIGS thin films with a large grain size, thereby ensuring excellent performance of CIGS solar cells.

Figure 18:
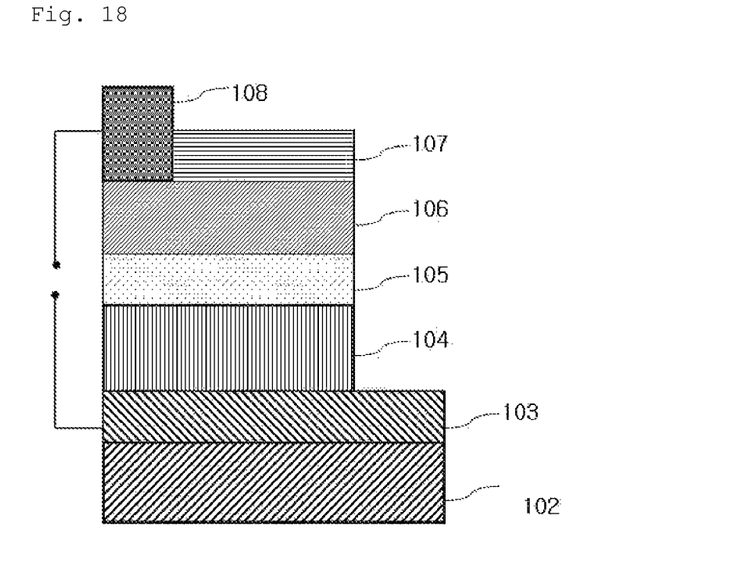
FIG. 18 is a cross sectional view illustrating structure of CIGS solar cell manufactured by one embodiment according to the present invention.

FIG. 18 is a cross sectional view illustrating structure of CIGS solar cell manufactured by one embodiment according to the present invention.

FIG. 18 is an illustrative example showing the structure of CIGS thin film solar cell having a light absorption layer that is formed by preparing the nanoparticle ink according to the one embodiment of the present invention; coating and/or printing the prepared ink to a rear electrode; and heating the electrode coated or printed with the ink.

As shown in FIG. 18, the structure is completed by arranging a rear electrode 103 on a substrate 102 and sequentially laminating a light absorption layer 104, a buffer layer 105, a window layer 106, and a front electrode 108 and an anti-reflection film 107 as the uppermost top part in order.

In the above embodiment, the present invention is characterized in that at least one nanoparticle ink such as $Cu_2Se$ nanoparticle ink, $(In,Ga)_2Se_3$ nanoparticle ink, $In_2Se_3$ nanoparticle ink, etc. is coated or printed on the rear electrode 103 followed by heating to form the light absorption layer 104.

More particularly, for the CIGS solar cell according to one embodiment of the present invention shown in FIG. 18, the substrate 102 consists of soda lime glass (SLG) or commonly known flexible board.

The rear electrode 103 consists of any one selected from Mo, Ni and Cu and has a thickness of 1 μm.

The light absorption layer 104 is formed according to the above method and is laminated in a thickness of 2 to 3 μm.

The buffer layer 105 consists of CdS and has a thickness of 50 nm.

The window layer 106 can consist of n-type zinc oxide (n-ZnO) or i-type zinc oxide (i-ZnO) and, is laminated in a thickness of 500 nm for n-ZnO and in a thickness of 50 nm for i-ZnO.

At a desired site of top portion of the window layer, the front electrode 108 and the anti-reflection film 107 are formed and the front electrode 108 consists of metals with high conductivities.

The front electrode 108 mostly consists of aluminum (Al) and preferably has a thickness of about 3 μm.

The anti-reflection film 107 reflects the light absorbed in the light absorption layer to prevent the light from being transmitted outside and is preferably laminated in a thickness of 100 nm using magnesium fluoride $MgF_2$, but, the constitutional materials are not particularly limited thereto.

While the present invention has been described with reference to the preferred embodiments, these are intended to illustrate the invention and do not limit the scope of the present invention. It will be obvious to those skilled in the art that various modifications and/or variations may be made therein without departing from the scope of the present invention. Further, constructional elements of the present invention can be replaced by a variety of constructional elements substantially same thereto. Also, it will be understood to those skilled in the art that a part of the constructional elements illustrated in the above detailed description may be eliminated without deterioration of performance and/or further constructional elements can be added to improve performance thereof. In addition, those skilled in the art can alter the order of steps of the method according to a variety of processing circumstances and/or equipment. Accordingly, the scope of the present invention should be defined by the appended claims and equivalents thereof rather than the embodiments illustrated in the detailed description of the present invention.

What is claimed is:

1. A method for manufacturing CIGS thin film solar cell, comprising:
   forming a first layer by coating or printing a first ink that contains $Cu_2(Se_{1-x}S_x)$ nanoparticles on a rear electrode formed on a substrate;
   heating the first layer;
   forming a second layer by coating or printing a second ink that contains $(In,Ga)_2(Se_{1-y}S_y)_3$ nanoparticles on the first layer; and
   heating the second layer,
   wherein x and y satisfy $0 \leq x \leq 1$, $0 \leq y \leq 1$.

2. The method according to claim 1, wherein the first ink further contains $(In,Ga)_2(Se_{1-z}S_z)_3$ nanoparticles, and
   wherein z satisfies $0 \leq z \leq 1$.

3. The method according to claim 1, wherein the first layer is a Cu-rich layer and the second layer is a Cu-poor layer.

4. The method according to claim 3, wherein a ratio of Cu/(In+Ga) of the Cu-rich layer is larger than 1, and a ratio of Cu/(In+Ga) of the Cu-poor layer is less than 1.

5. The method according to claim 1, wherein the rear electrode is formed between the substrate and the first layer.

6. The method according to claim 5, wherein the rear electrode contains at least one of Mo, Ni and Cu.

7. The method according to claim 1, wherein at least one of the first layer and the second layer is heated under a Selenium (Se) atmosphere.

8. The method according to claim 1, wherein the first layer and the second layer are converted into a light absorption layer after the heating processes.

9. The method according to claim 8, wherein a predetermined ratio of Ga/(In+Ga) of the light absorption layer ranges from about 0.3 to about 0.6, and
   a band gap thereof ranges from about 1.2 eV to about 1.4 eV.

10. The method according to claim 1, further comprising:
    forming a third layer by coating or printing a third ink that contains $(In,Ga)_2(Se_{1-y}S_y)_3$ nanoparticles on the rear electrode before forming the first layer; and
    heating the third layer before forming the first layer.

* * * * *